United States Patent [19]

Olsen

[11] 4,162,454

[45] Jul. 24, 1979

[54] NOISE IMMUNE VOLTAGE COMPARATOR

[76] Inventor: Svein E. Olsen, Fölvägen 16, Södertälje, Sweden

[21] Appl. No.: 860,375

[22] Filed: Dec. 14, 1977

[30] Foreign Application Priority Data

Jun. 15, 1977 [SE] Sweden .................. 7706953

[51] Int. Cl.² ........................................... H03K 5/153
[52] U.S. Cl. .................................... 328/147; 307/354; 307/358; 307/359; 307/362; 328/150
[58] Field of Search ............... 307/350, 354, 358, 359, 307/362, 290; 328/146, 147, 150

[56] References Cited

U.S. PATENT DOCUMENTS

| | | | |
|---|---|---|---|
| 3,737,790 | 6/1973 | Brown | 307/358 X |
| 3,999,083 | 12/1976 | Bumgardner | 307/358 |

*Primary Examiner*—John Zazworsky
*Attorney, Agent, or Firm*—Lewis H. Eslinger

[57] ABSTRACT

A noise immune voltage comparator with controlled hysteresis characteristics. The hysteresis gap thereof is adjustable from positive down to negative voltage values, zero volt included and in all cases a safe bistable function is maintained. The comparator is realized with two amplifiers each provided with positive feedback and each supplied with a difference voltage which is the difference between the voltage subjected to comparison and a reference voltage, the output signal from one of the amplifiers, after multiplication with a factor that may be greater than zero, zero or less than zero, being combined with the input voltage of the other amplifier.

16 Claims, 44 Drawing Figures

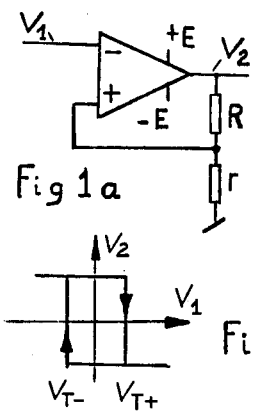
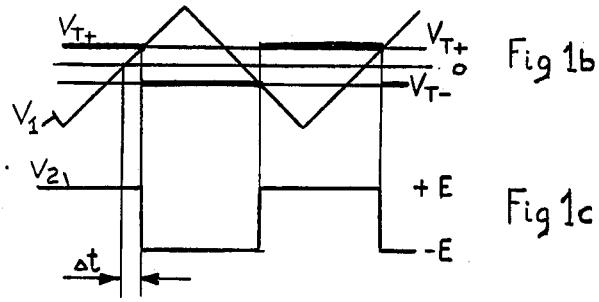
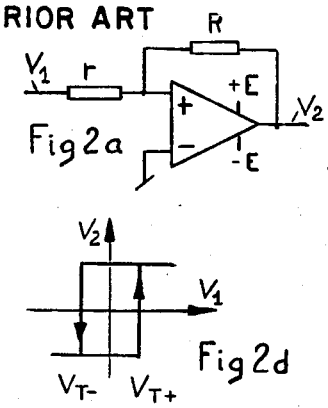
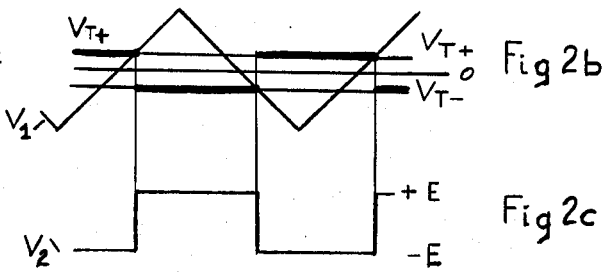
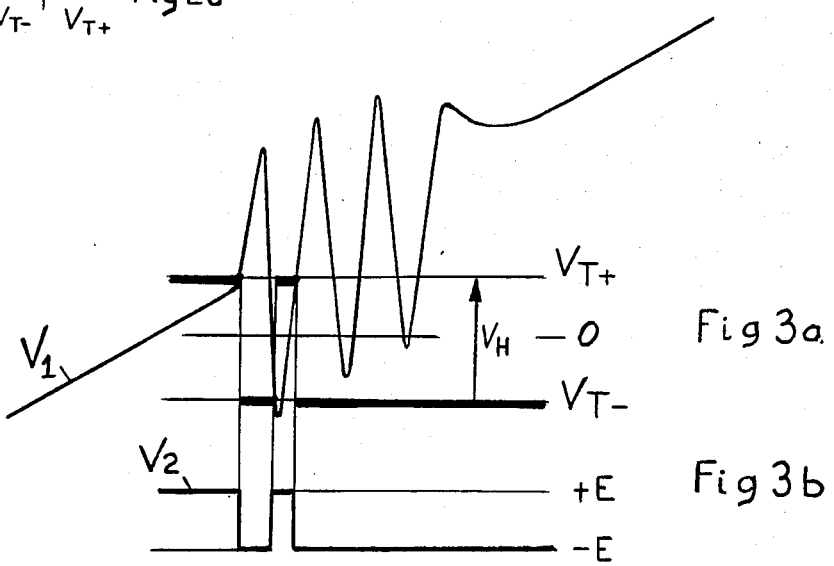

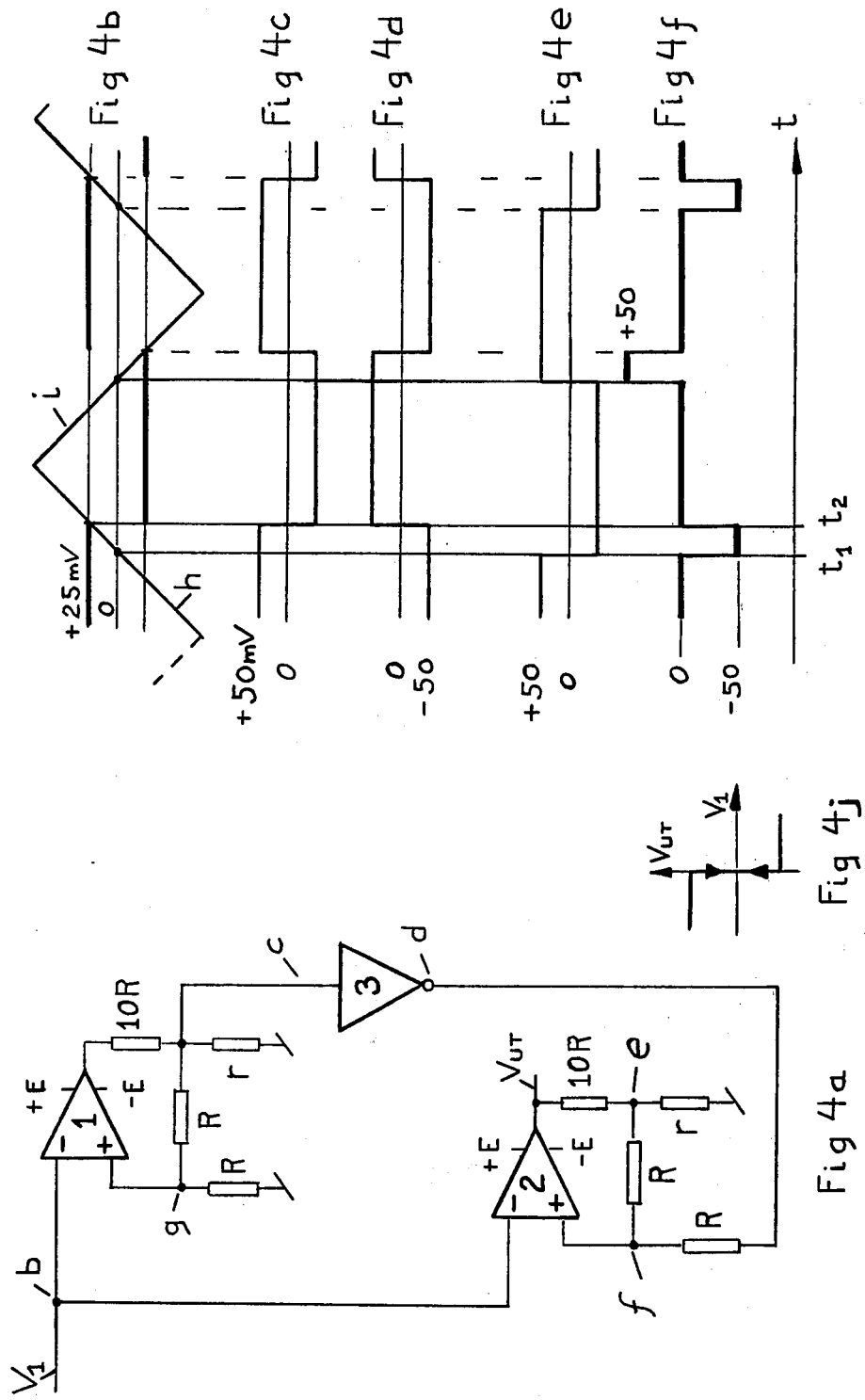

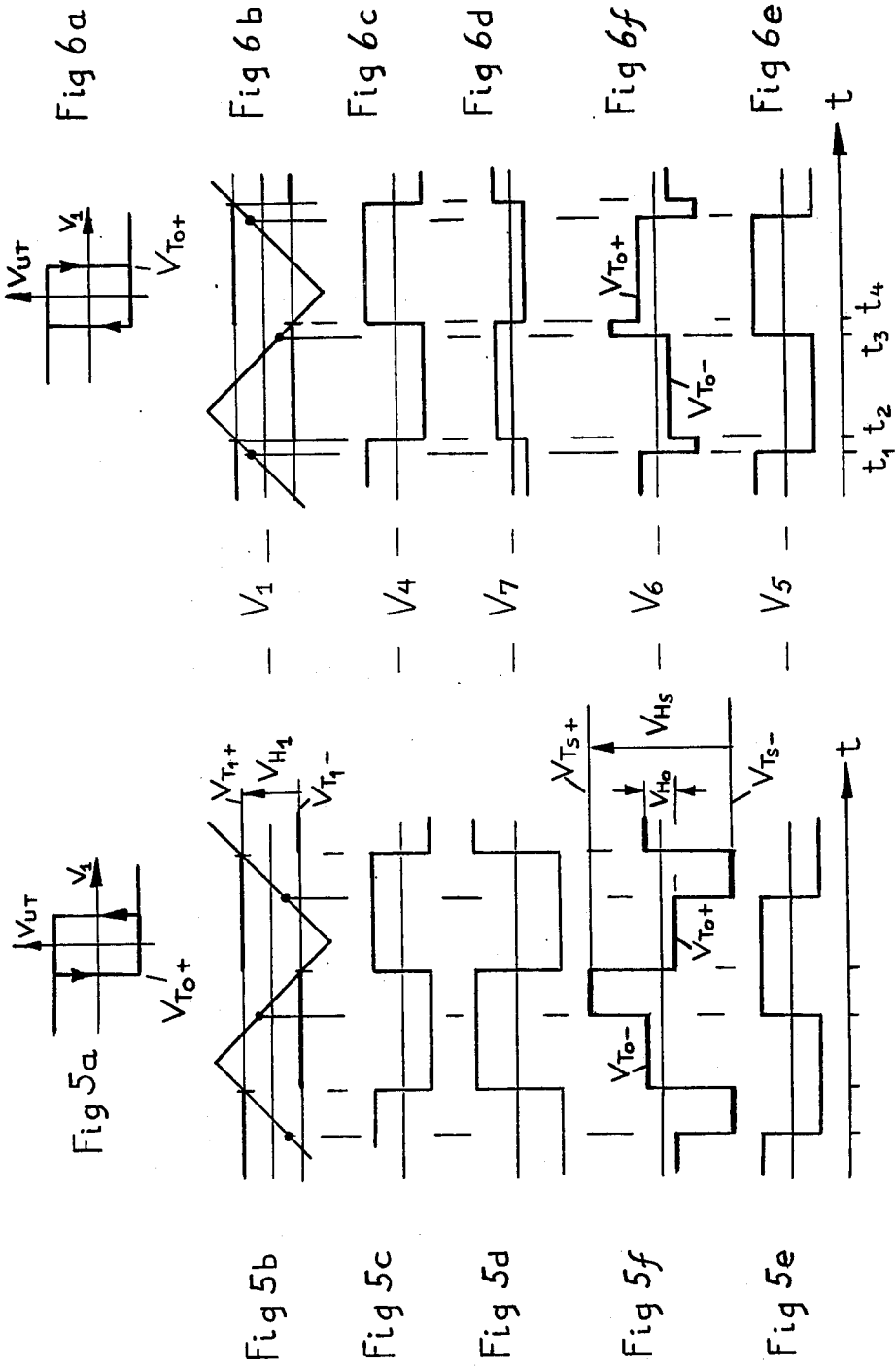

NOISE IMMUNE VOLTAGE COMPARATOR

BACKGROUND OF THE INVENTION

The present invention relates to a noise immune voltage comparator with controlled hysteresis characteristics and with well defined transitions.

In a voltage comparator a voltage is compared to a reference voltage and upon coincidence therebetween the output signal of the comparator will be subjected to a transition, that is, its level will abruptly shift from one level to another. The voltage subjected to the comparison may be periodical or aperiodical and may have steep or slowly rising positive or negative sloping flank portions. The reference voltage is usually a constant DC voltage, the magnitude of which is adjustable.

A voltage comparator fundamentally comprises a fast responding amplifier, the output circuit of which is a transistor switch having output levels which are limited upwardly and downwardly and which by way of example may be the supply voltage of the circuit. In order that the output signal of the comparator shall abruptly shift from one level to the other also in response to slowly varying input signals, a very high gain of the amplifier is desired. In the following specification and claims, the expression "input signal" relates to the difference between the voltage subjected to the comparison and the reference voltage. Since an amplifier cannot have an infinite gain, there will always exist a narrow linear range of amplification within which the course of the output signal must be regarded as a linear one. If the input signal is a slowly varying one, then it will stay in and within the vicinity of said linear range for a comparatively long time.

The fact that the input signal lies within the linear range of the amplifier means an attendant risk that the amplifier will start to self-oscillate.

The fact that the input signal is within the vicinity of the linear range of the amplifier after a completed transition in the output signal from the amplifier means that the voltage comparator has a poor noise immunity. Shortly after a completed transition the noise immunity may be considered to be non-existent since at that time the input signal is very close to the high gain linear range, which implies that a very small noise signal, for example in the order of about 1 millivolt, will be highly amplified and bring about an undesired transition in the output signal from the comparator. For this reason, the amplifier is usually provided with positive feedback. Thereby the amplifier is imparted a multivibrator like course of transition which prevents the input signal from staying in the "linear range" of the amplifier for a long time, even if the input signal is slowly varying. By providing the amplifier with positive feedback, its noise immunity will increase in proportion to the introduced degree of feedback.

Since the present invention starts from voltage comparators with positive feedback, the operation of such an amplifier will at first be considered.

The output signal from the comparator will depend on what has previously happened within the comparator. For this reason said transitions in the output signal from the comparator will occur after a certain time delay in comparison to the instant in which the voltage subjected to the comparison coincides with the reference voltage. If, for example, the voltage subjected to comparison is rising and coincides with the reference voltage, then the step-like transition in the output signal will not occur until the voltage subjected to comparison has risen further above the reference voltage a specific, characteristic amount, up to a level termed the positive transition level of the comparator. If, for example, the voltage subjected to comparison is descending and coincides with the reference voltage, the step-like transition in the output signal of the comparator will not occur until the voltage subjected to comparison has descended further down a specific amount under the reference voltage, down to a level termed the negative transition level of the comparator. The voltage difference between the positive and the negative transition levels is termed the hysteresis gap of the comparator. In the voltage comparators belonging to the prior art, the positive transition level is at a higher level than the negative.

The width of the hysteresis gap is of great practical importance. It often happens that the voltage subjected to comparison is impaired by high frequency noise signals or by noise voltages, so called voltage spikes, which may be generated when, for example, a switch is turned on or off. If the amplitude of the voltage spikes is higher than the width of the hysteresis gap of the comparator so called multiple transitions may occur (compare FIGS. 3a–b). When this happens, the output signal of the comparator is subjected to multiple transitions indicating voltage coincidence between the voltage subjected to comparison and the reference voltage, while actually there is voltage coincidence between the reference voltage on the one hand and the voltage subjected to comparison plus the noise signal voltage on the other. Quite often several voltage spikes occur at a time and during unfavorable conditions several multiple transitions may occur. In order to render the comparator insensitive to noise signals, that is, in order to make it noise immune, it is suitable to use a wide hysteresis gap. On the other hand, a wide hysteresis gap means that the instant at which the transition appears in the output signal from the comparator will be much delayed in relation to the instant of voltage coincidence between the voltage subjected to the comparison and the reference voltage in case the voltage subjected to the comparison is a slowly varying one. This particular kind of delay (hysteresis) where the delay is varying with the slope of the voltage subjected to comparison may be very troublesome and non-desired, especially in such applications wherein the comparator is used as an analog-to-digital converter and minimum time delayed transitions are desired.

In constructing a voltage comparator today a compromise must be made between the following mutually contradicting qualities, namely a wide hysteresis gap which promotes the noise immunity and consolidated transitions (that is, once a transition has occurred in the output signal, the comparator will be comparatively insensitive to noise signals) also for slowly sloping flanks of the voltage subjected to comparison, and a narrow hysteresis gap which implies bad noise immunity but short time delay. The comparators of the prior art have, if using a hysteresis gap at all, a hysteresis gap which is a compromise between the above-mentioned mutually contradicting qualities.

SUMMARY OF THE INVENTION

The present invention seeks to eliminate the drawbacks of the previously used comparators. In the comparator of the present invention, the hysteresis gap is continuously adjustable from positive voltage values for the hysteresis gap (in which case the positive transition level has a higher potential than that of the negative transition level) down to negative values (in which case the positive transition level has a lower potential than that of the negative one) of the hysteresis gap. A hysteresis gap of 0 volt is also possible to achieve with the comparator in accordance with the invention. In all cases a safe bistable function is guaranteed.

The characteristic features of the comparator in accordance with the present invention are set forth in the accompanying claims.

In accordance with the present invention, it is accordingly possible to realize a comparator which independently of the elected hysteresis gap provides a good noise immunity combined with assured and distinct transitions. A comparator having a hysteresis gap of 0 volt (which provides the minimum time delay) may also be realized.

It is, therefore, an object of the present invention to provide an improved comparator which avoids the aforenoted problems of the prior art.

BRIEF DESCRIPTION OF THE DRAWINGS

Several embodiments of the invention will be described below in connection with the accompanying drawings wherein:

FIG. 1a is a circuit diagram showing a prior art basic voltage comparator with positive feedback and operating in inverting mode;

FIGS. 1b and 1c are diagrams showing different voltage waveforms in the device shown in FIG. 1a;

FIG. 1d is a diagram showing the transfer characteristic achieved with the device shown in FIG. 1a;

FIG. 2a is a circuit diagram of a prior art, basic voltage comparator with positive feedback operating in noninverting mode;

FIGS. 2b and 2c are diagrams showing different voltage waveforms in the device of FIG. 2a;

FIG. 2d is a diagram showing the transfer characteristic of the device in accordance with FIG. 2a;

FIG. 3a is a voltage diagram showing an input signal ($V_1$) on which a number of noise spikes are superimposed, said diagram also showing how the operative threshold level of a voltage comparator, for example, of the kind indicated in FIG. 1a, will successively shift up and down;

FIG. 3b is a voltage diagram showing the output voltage of a comparator in accordance with FIG. 1a when supplied with a voltage waveform of the kind shown in FIG. 3a;

FIG. 4a is a circuit diagram of a special case of a voltage comparator in accordance with the present invention wherein the principles which form the basis of the present invention are clearly set forth;

FIGS. 4b–4f are voltage diagrams showing the voltage waveforms in certain points of the circuit of FIG. 4a;

FIG. 4j is a diagram showing the transfer characteristic of the circuit indicated in FIG. 4a;

FIG. 5a is a diagram similar to that of FIG. 4j but for a different setting of the gain of inverter 3 of the circuit in FIG. 4a;

FIGS. 5b–5f are voltage diagrams showing voltage waveforms in corresponding points in the circuit of FIG. 4a but achieved with said different setting of the gain;

FIGS. 6a–6f are transfer characteristic and voltage diagrams, respectively, corresponding to those of FIGS. 5a–5f although obtained for still another setting of the gain of amplifier 3 in FIG. 4a;

FIG. 8 is a circuit diagram of an embodiment of a voltage comparator in accordance with the present invention corresponding to the comparator block indicated in FIG. 4a;

DETAILED DESCRIPTION OF PREFERRED EMBODIMENTS

Figure 7:
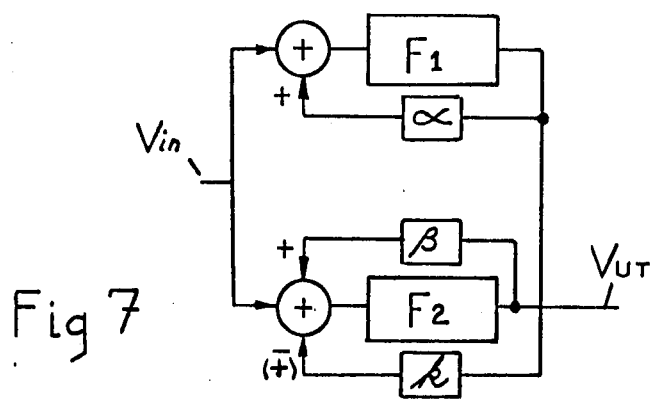
FIG. 7 is a block diagram of a general voltage comparator in accordance with the present invention, wherein $V_{in}$ is the difference between the voltage subjected to comparison and a reference voltage which may be periodic or aperiodic and also may be 0 volt.

Before the present invention is described in detail, the operation of two basic, previously known circuits shall be explained in connection with FIGS. 1a–1d and 2a–2d and thereafter the importance of the hysteresis gap when noise voltages are present shall be described in connection with FIGS. 3a, and 3b and finally various fundamental embodiments of the voltage comparator in accordance with the present invention shall be described in connection with FIGS. 4–21.

In FIG. 1a, a conventional operational amplifier having an inverting and a non-inverting input (− and + respectively) and an output is shown. The operational amplifier is supplied with supply voltages ± E volts. For the sake of convenience earth (ground), that is 0 volt, is used as a reference voltage. A part of the output voltage is fed back via a voltage divider comprising resistors R and r, to the non-inverting input, that is, the amplifier is rendered to operate with positive feedback. For the sake of clarity, the voltage ($V_1$) subjected to comparison, which is fed to the inverting input of the amplifier, is selected to be of a triangular waveform as shown in FIG. 1b. In FIG. 1b the reference voltage 0 volt has been indicated with a continuous horizontal line while reference designation $V_{T+}$ is the voltage level of the voltage $V_1$ subjected to the comparison at which the output signal $V_2$ from the comparator will have or subject a transition as voltage $V_1$ increases. Level $V_{T+}$ will hereinafter be termed the positive transition level. In the same manner, reference designation $V_{T-}$ will hereinafter refer to the level of the voltage $V_1$ subjected to comparison at which the output signal from the comparator will have a transition as voltage $V_1$ decreases. Level $V_{T-}$ will hereinafter be termed the negative transition level. In FIG. 1c there is shown how the output signal $V_2$ will have a transition in response to voltage $V_1$. Comparing FIG. 1b with 1c, it is apparent that the transition in the output signal $V_2$ will occur first after a certain time delay $\Delta t$ after voltage coincidence between the voltage subjected to comparison and the reference voltage. From FIG. 1b it is also clear that the positive transition level $V_{T+}$ has a higher potential than the negative transition level $V_{T-}$ and that accordingly the so-called hysteresis gap (which is defined as $V_H = V_{T+} - V_{T-}$) is greater than zero. The diagram showing the transfer characteristic of the voltage comparator is shown in FIG. 1d.

It should be noted that the transition level of a voltage comparator having a hysteresis gap will notoriously shift. When, for example, the voltage $V_1$ subjected to comparison reaches the positive level $V_{T+}$, the transition level of the comparator will shift from high to low level $V_{T-}$ and in this instant $V_1$'s distance (measured in volts) to transition level $V_{T-}$ change step-wise which, of course, is highly desirable from noise immunity point of view.

FIGS. 2a–2d correspond to FIGS. 1a–1d with the exception that the voltage $V_1$ subjected to comparison is supplied at the non-inverting input of the operational amplifier. Also in the circuit in FIG. 2a the hysteresis gap $V_H$ is greater than 0 volt.

In FIG. 3a there is shown a positive sloping flank of the voltage $V_1$ subjected to comparison. The flank suffers from noise spikes and is supplied at the inverting input of the operational amplifier of FIG. 1a. As voltage $V_1$ is rising and crosses the reference voltage, which here has been selected to be 0 volt, and gradually for the first time crosses the positive transition level $V_{T+}$, the output signal from the operational amplifier will have a transition from $+E$ volts to $-E$ volts, as is apparent from FIG. 3b. The noise spike gradually reaches its maximum value and starts to steeply fall towards its minimum value, thereby crossing the negative transition level $V_{T-}$ in which instant the output signal from the operational amplifier will have a transition from $-E$ volts to $+E$ volts. Also, the next following noise spike will cross transition level $VT_+$ and thereby cause the output voltage from the operational amplifier to have a transition from $+E$ to $-E$ volts. However, the minimum value of this second noise spike will not reach down to $V_{T-}$ and will accordingly not cross this level, which means that the output level of the operational amplifier will remain at the $-E$ volt level. The rest of the noise spikes will not alter the $-E$ volt level of the output signal. It is apparent that the two non-desired transitions of the output signal may be eliminated by increasing the width of the hysteresis gap $V_H$. With the depicted hysteresis gap in FIG. 3, it is also apparent that non-desired transitions in the output signal would fail to appear if the positive rising flank would have a steeper slope than the one depicted in the drawing. In the latter case, the minimum value of the first noise spike would namely not reach down to and would accordingly not cross the negative transition level $V_{T-}$ thereby not altering the already existing voltage level of the output signal. If, on the other hand, the slope of the rising flank would not be as steep as indicated in FIG. 3a, then some more non-desired transitions would occur in the output signal. In the latter case, such non-desired transitions could be avoided by increasing the width of the hysteresis gap $V_H$ but one then immediately recognizes that the time from the instant at which voltage coincidence exists between voltage $V_1$ and the reference voltage to the instant at which the output signal will have a transition is unduly long.

In order to illustrate the present invention, a special case thereof will first be described; namely, a comparator circuit in which the hysteresis gap $V_H$ is 0 volt. The circuit is shown in FIG. 4a and may be viewed upon as comprising two circuits of the kind indicated in FIG. 1a, said circuits both being supplied with one and the same voltage $V_1$ subjected to comparison. For the sake of clarity, it is also supposed that the reference voltage is 0 volt. A divided part (r/10 R) of the output voltage from the upper comparator or operational amplifier 1 is inverted in an inverter 3 and is added to quite the same divided part (r/10 R) of the output signal from the lower comparator or operational amplifier 2 (via two identical resistors R, which implies that the voltage sum in point f will be divided by 2). In FIG. 4b the waveform of voltage $V_1$ at point b in FIG. 4a is shown. This voltage is supplied to each of the comparators. The voltage waveform shown in FIG. 4c is the one existing in point c in FIG. 4a. This voltage is inverted in inverter 3 at the output of which a voltage having the form indicated in FIG. 4d will exist. Output signal $V_{ut}$ from operational amplifier 2 is depending on what has previously happened within the amplifier and will have the form indicated in FIG. 4e, although the amplitude swing of signal $V_{out}$ will be $\pm E$ volt. The waveform shown in FIG. 4e exists at point e in FIG. 4a. In the summing point f in FIG. 4a, a voltage will appear which is half the sum of the voltages having the waveforms indicated in FIGS. 4d and 4e. In FIG. 4f the waveform of the voltage appearing in said point f is illustrated. The waveform may be explained in the following manner:

First consider the dashed negative flank of the waveform in FIG. 4b. For this part of the waveform 4b, each of the output signals from the amplifiers is positive. Accordingly, the signal in the summing point f will be zero. In point g in FIG. 4a the transition level will accordingly be $V_{T+}$ (for example, +25 millivolt). The next following positive flank of the input signal, that is, section h in FIG. 4b, has to cross 0 volt before it reaches the transition level of comparator 1. However, 0 volt is the transition level of comparator 2 and accordingly comparator 2 will change its state (that is, the output signal thereof will have a transition). Since the comparator has positive feedback a distinct transition will occur. The output signal from comparator 2 will accordingly go down to low level which means that the voltage in the summing point f will fall down to $-50$ millivolts. When the positive sloping flank h in FIG. 4b rises to the transition level of comparator 1 (said transition level is by way of example supposed to be $+25$ millivolts), then comparator 1 goes down to low level. The output signals from each of the comparators will now be at low levels and the voltage in summing point f will accordingly be 0 volt. Comparator 2 is now ready to shift to high level, which means that the voltage in summing point f will increase to high level ($+50$ millivolt) when the next following flank (flank i in FIG. 4b) will cross the transition level of comparator 2, said transition level being 0 volt as mentioned above.

In this connection it should be noted that the two operative transition levels of comparator 2 are identical (0 volt each) which means that the hysteresis gap $V_H=0$ volt. In spite of this, each transition will be distinct and will have a certain degree of noise immunity. When voltage $V_1$ subjected to comparison is increasing and reaches the positive transition level $V_{T+}$ (0 volt) of comparator 2, the transition level of this comparator will change to $-50$ millivolt (and this new level will hereinafter be termed security level) and at this instant the distance (measured in volts) of the voltage $V_1$ to the security level will be step-like (50 millivolts) which is highly desirable from noise immunity point of view. This security level will remain until the positive sloping voltage $V_1$ subjected to comparison reaches the positive transition level of comparator 1 ($+25$ millivolt) which means that a well defined noise immunity of the comparator circuit has been established.

Noise immunity may be defined as the smallest possible noise signal (more particularly, the peak-to-peak value thereof) which may cause undesired transitions in the output signal of comparator 2. In the above described embodiment wherein the security level (50 millivolts) is wider than the transition level (25 millivolts) of comparator 1, it is the transition level of comparator 1 that will define the noise immunity of the comparator circuit.

If, for example, a noise signal would occur during time interval $t_1-t_2$ in FIG. 4b and the amplitude of this noise signal is sufficiently high to render comparator 1 to change its state, the security level ($-50$ millivolt) of comparator 2 will be lost and comparator 2 will have a transition level of 0 volt. If during these conditions a negative sloping part of the noise signal is sufficiently "deep" to go down to and cross the transition level of 0 volts (which is the worse case than can happen), then an undesired transition will result in the output signal of the second comparator. In this particular case, the noise immunity may accordingly be defined as half the hysteresis gap of the first comparator (25 mV peak-to-peak).

The diagram showing the transfer characteristic of the circuit of FIG. 4a is shown in FIG. 4j.

Now, if the gain or amplification factor of inverter 3 is changed so that the signal from comparator 1 is inverted and amplified by a factor of 1.5, waveforms of the kind shown in FIGS. 5b–5f will appear in points b–f in FIG. 4a. The corresponding transfer characteristic is shown in FIG. 5a. As appears from FIG. 5a, $V_{T+}$ is smaller than $V_{T-}$ and the hysteresis gap is accordingly negative (in the shown example $-25$ millivolt). Note that even for negative hysteresis gaps there will be a safe bistable function.

Now, if the amplification factor of inverter 3 in FIG. 4a is altered so that the signal from comparator 1 is inverted and amplified by a factor of 0.5, then voltage waveforms of the kind indicated in FIGS. 6b–6f will appear in points b–f in the circuit indicated in FIG. 4a. In this case the hysteresis gap is positive since $V_{T+}$ is greater than $V_{T-}$. The corresponding transfer characteric is shown in FIG. 6a.

By adjusting the amplification factor of inverter 3 it will accordingly be possible to select any hysteresis gap from positive values down to negative values, 0 volt included.

A block diagram of the comparator in accordance with the present invention is shown in FIG. 7. Reference designations 1 and 2 refer as before to an amplifier or a comparator which has positive feedback. Both amplifiers are supplied with the input voltage $V_{in}$ which is constituted by voltage $V_1$ subjected to comparison minus reference voltage $V_{ref}$. The reference voltage may be constant or periodic. The output signal from comparator 1 is multiplied with a factor k and is subtracted (or added if the two amplifiers are operating in different modes) from the positively fed back part of the output signal from the second amplifier 2. The feedback factors of comparators 1 and 2 are $\alpha$ and $\beta$ respectively.

Figure 8:
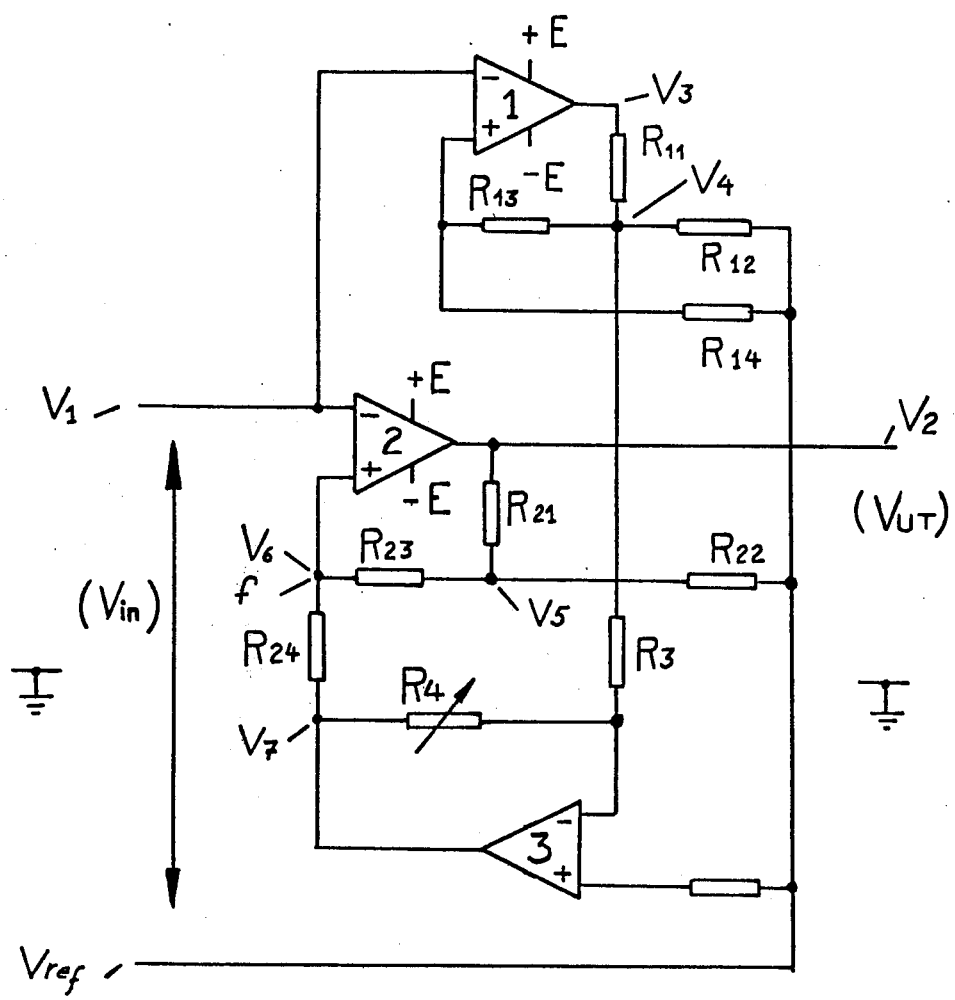

In FIG. 8 a tested embodiment of the invention is shown. The voltage $V_1$ subjected to comparison and the reference voltage $V_{ref}$ which may be any selected voltage are each separately supplied to the first and the second comparators 1 and 2, respectively. Voltage $V_4$ which is a part of the output signal $V_3$ from comparator 1 and voltage $V_{ref}$ are supplied to inverter 3 which in this case is a linear amplifier with an amplification factor $F=-K$. This amplification factor may be varied with potentiometer $R_4$. The resulting voltage $V_7$ and another voltage $V_5$, which is a part of the output signal $V_2$ of the second comparator 2, and voltage $V_{ref}$ are added, via resistors $R_{24}$ and $R_{23}$, together in summing point f in which voltage $V_6$ will appear. Voltage $V_6$ is fed to the non-inverting input of the second comparator 2. Voltage $V_6$ may now be changed with potentiometer $R_4$. The hysteresis gap of the comparator block may now be set with $R_4$ so that it will be positive, zero or negative. The circuit is dimensioned as per the following:

$R_{14}=R_{13}>>R_{12}>>(1/R_3)$ and $R_{24}=R_{23}>>R_{22}$ and $K=R_4/R_3$.
$V_4=2\cdot\alpha\cdot V_3+V_{ref}$ where $\alpha=R_{12}/2\cdot(R_{11}+R_{12})$
$V_5=2\cdot\beta\cdot V_2+V_{ref}$ where $\beta=R_{22}/2\cdot(R_{21}+R_{22})$
$V_6=\beta\cdot V_2-k\cdot V_3+V_{ref}$ where $k=K\cdot\alpha>0$ $V_7=-2\cdot K\cdot\alpha\cdot V_3+V_{ref}$ For the sake of clarity, it has here been supposed that the supply voltages to comparators 1 and 2 and to inverter 3 are $\pm E$ volts and that they are identical with the limited output levels of the amplifiers. The hysteresis gap is defined as before, that is, $V_H=V_{T+}-V_{T-}$. For the first comparator the transition level for a positive sloping signal is $V_{T1+}=\alpha\cdot E+V_{ref}$ and for a negative sloping signal the transition level is $V_{T1-}=-\alpha\cdot E+V_{ref}$ which means that the hysteresis gap of the comparator 1 equals $$V_{H1}=2\cdot E\cdot\alpha \tag{1}$$

Figure 9:
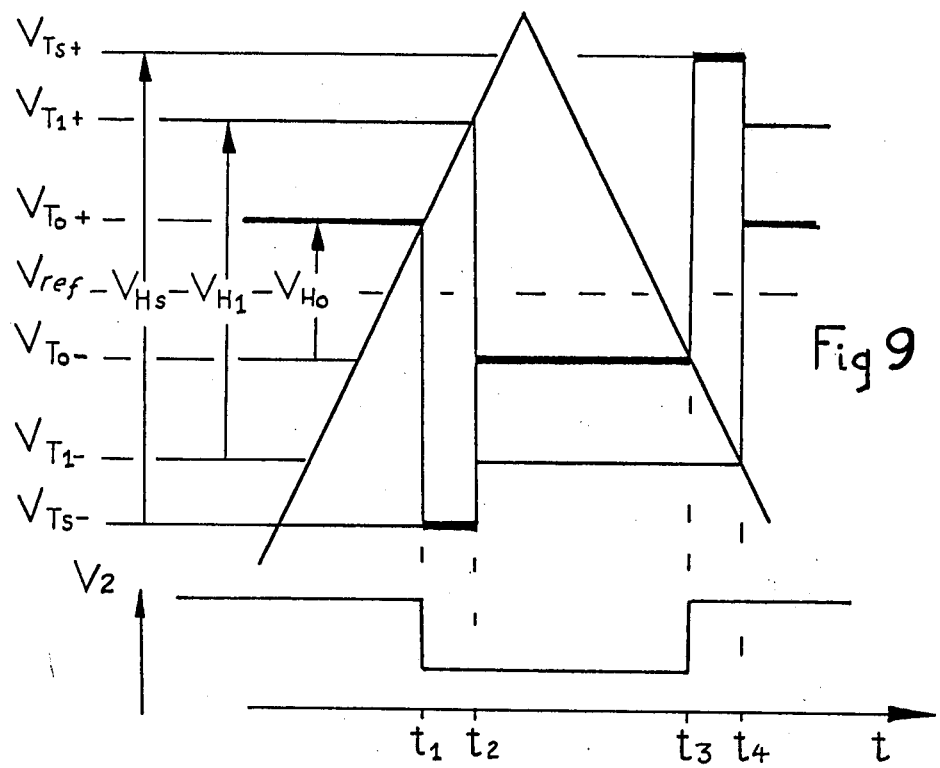
FIG. 9 is a voltage diagram which is used to explain the various hysteresis gaps and threshold values which are present in a voltage comparator operating with positive hysteresis gap in accordance with the present invention.

For comparator 2 (the output comparator) two hysteresis gaps are defined, namely, an operative gap $V_{Ho}$ and a security gap $V_{HS}$ (corresponding to the security gap in the waveform of FIG. 5f) and it is contemplated that $|V_{Ho}|<V_{H1}$. These hysteresis gaps are shown in FIG. 9. The operative gap may be considered as an operative or as a working gap while the security gap $V_{Hs}$ will appear only during time intervals $(t_1, t_2)$ and $(t_3, t_4)$ that is during the time intervals when the comparators or amplifiers are most susceptible to noise. By using the security gaps well defined transitions are obtained. The term "well defined" as used herein should be interpreted so that no self-oscillation will occur in comparator 2 and the influence of noise signals on the transitions is suppressed.

Before the transition occurs (that is, during time intervals $t_4\to t_1$ and $t_2\to t_3$ in FIG. 9), the operating gap is $$V_{Ho}=2\cdot E(\beta=k) \tag{2}$$

and its associated transition levels are $$V_{To+} = E(\beta - k) + V_{ref}$$

and $$V_{To-} = -E(\beta - k) + V_{ref}$$

After a transition has been completed (that is, during time intervals $t_1 \to t_2$ and $t_3 \to t_4$) the security gap will be $$V_{Hs} = 2E(\beta + k) \tag{3}$$

and its associated transition levels are $$V_{Ts+} = E(\beta + k) + V_{ref} \text{ and}$$

$$V_{Ts-} = -E(\beta + k) + V_{ref}$$

Relation (2) above which relates to the operative gap $V_{Ho}$ indicates that this gap may be positive, zero or negative depending on the difference $(\beta - k)$.

Time intervals $(t_1, t_2)$ and $(t_3, t_4)$ are proportional to $V_{H1}$ and inversely proportional to $dV_1/dt$ and are restricted downwardly by the delay times existing in the comparators or amplifiers. These delay times may be extended with the aid of delay circuits.

By varying $R_4$ hysteresis gaps are obtained which may be positive, zero, or negative and with the circuit shown in FIG. 8 waveforms similar to those indicated in FIGS. $rb$–$4f$, $5b$–$5f$ and $6b$–$6f$ are obtained provided that voltage $V_1$ subjected to comparison is selected to be a symmetrical triangular wave, the DC component of which is zero ($V_0 = 0$) and provided that the reference voltage is selected to be zero ($V_{ref} = 0$ V) which implies that the waveforms as shown will lie symmetrically around zero potential and that the output voltage $V_2$ equals $V_5$ (disregarded from a proportionality constant). The voltage scale of FIGS. $4b$, $5b$, $6b$ and FIGS. $4f$, $5f$ and $6f$ is expanded with a factor of 2. The voltage levels indicated in FIG. 9 in heavy lines correspond to voltage $V_6$ in FIG. 8. If in FIG. 8 voltage $V_1$ and reference $V_{ref}$ are interchanged, that is, if voltage $V_1$ is supplied to input $V_{ref}$ in FIG. 8 and $V_{ref}$ is supplied to the inverting inputs of the comparators 1 and 2, a set of transfer diagrams similar to those of FIGS. $4j$, $5a$ and $6a$ are obtained although the diagrams will be mirrored in axis $V_1$ (in the same manner as FIG. $1d$ is mirrored in $V_1$ to achieve the transfer diagram shown in FIG. $2d$).

The precise dimensioning of $\alpha$, $\beta$ and $k$ is a question of optimizing and is depending on the intended application of the comparator block.

Figure 10:
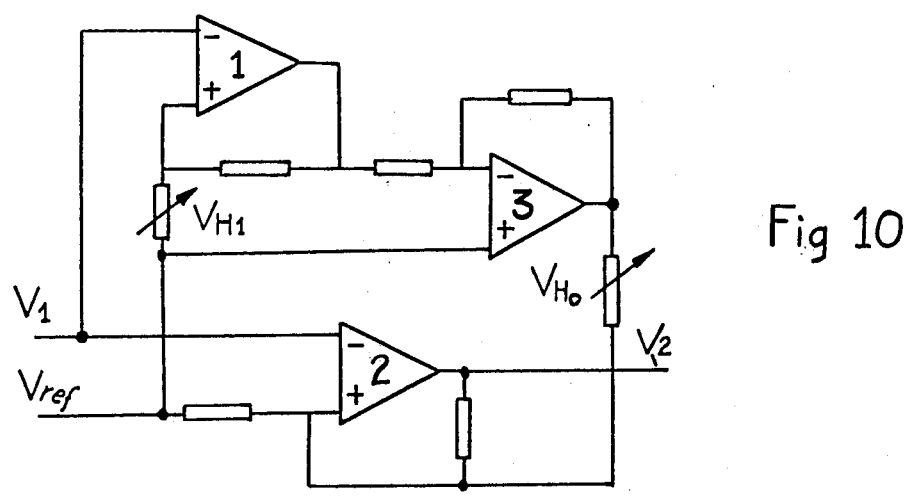
FIG. 10 is a circuit diagram of another embodiment of a voltage comparator which is similar to that of FIG. 8 but has better high frequency characteristics.
Figure 11:
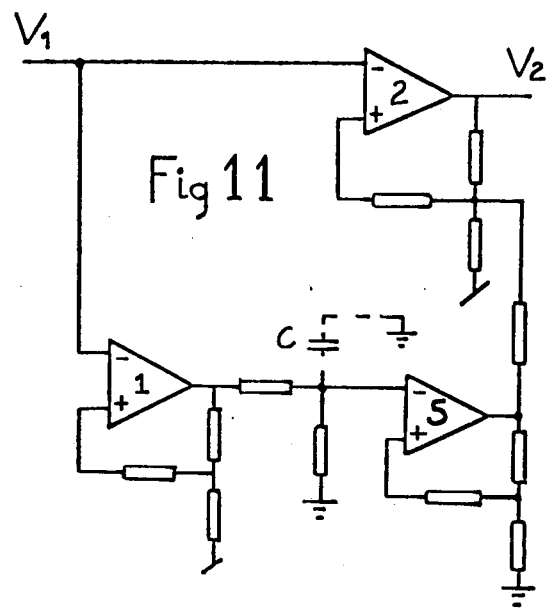
FIGS. 11–15 each show a separate embodiment of a voltage comparator in accordance with the present invention.

In FIG. 10 a modification of the circuit of FIG. 8 is shown. The circuit of FIG. 10 has provisions for a low impedance reference input and will accordingly provide better high frequency characteristics. In FIGS. 10–19, the reference input has been connected to zero potential for the sake of clarity. In the circuit of FIG. 11, the linear inverter has been replaced with an amplifier 5 with positive feedback similar to the basic comparator circuit in FIG. $1a$. If required, a capacitor C, which acts as a delay circuit, may be used thereby extending the duration of the security gap $V_{Hs}$. Instead of using this comparator circuit, a transistor switch operating in inverting mode (negator) may be used. The output signals from the transistor switch shift between limited voltage levels. Capacitor C' of FIG. 13 is used for the same purpose as capacitor C in FIG. 11 and will, moreover, to a certain degree contribute to noise suppression. In the comparator circuit of FIG. 12 the voltage $V_1$ subjected to comparison is supplied at the non-inverting input of the first amplifier and at the inverting input of the second amplifier. With this arrangement, the need of a separate inverter is eliminated.

Figure 12:
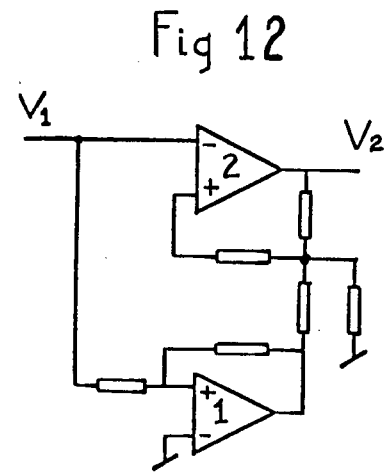
Figure 13:
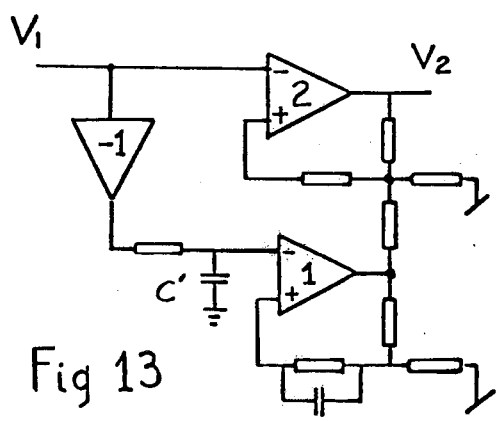
Figure 14:
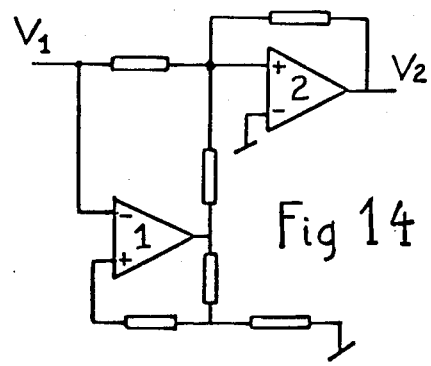
Figure 15:
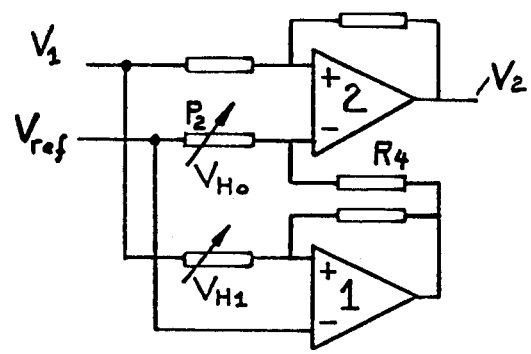

The circuit in FIG. 14 is a modification of the circuit in FIG. 12. In FIG. 15 there is shown a circuit that also makes use of only two operational amplifiers. The voltage subjected to comparison is supplied at the non-inverting inputs of the amplifiers while the reference voltage is supplied at the inverting input of each amplifier. Each amplifier is wired to have positive feedback. As an alternative, voltage $V_1$ may be supplied at the inverting input of each amplifier while the reference voltage is supplied at the non-inverting input of each of the amplifiers. By adjusting potentiometers $V_{Ho}$ and $V_{H1}$, the operative hysteresis gap $V_{Ho}$ and the hysteresis gap $V_{H1}$ respectively may be set.

Figure 16:
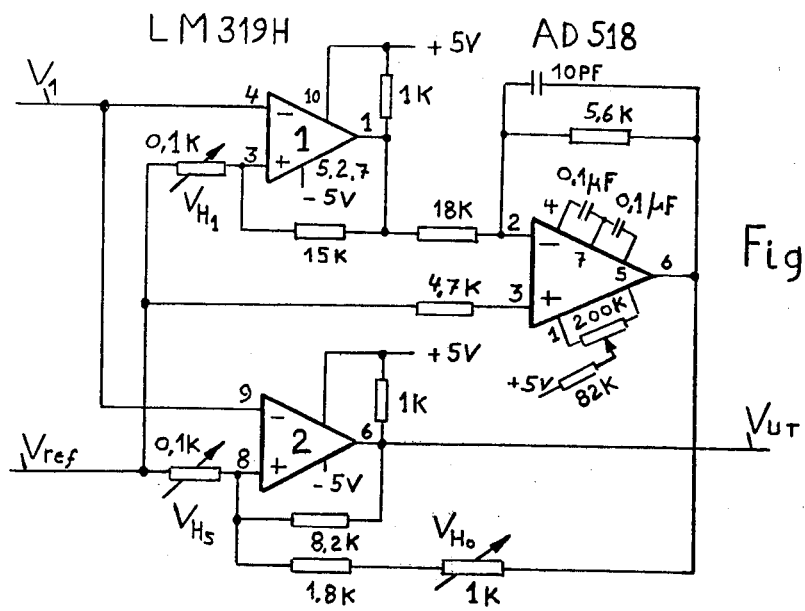
FIG. 16 is a detailed circuit diagram of a voltage comparator in accordance with FIG. 10.

In FIG. 16 a detailed circuit diagram of the circuit shown in FIG. 10 is shown. The resistance of the resistors is indicated in ohms and suffix k refers to kilo ohms.

Figure 17:
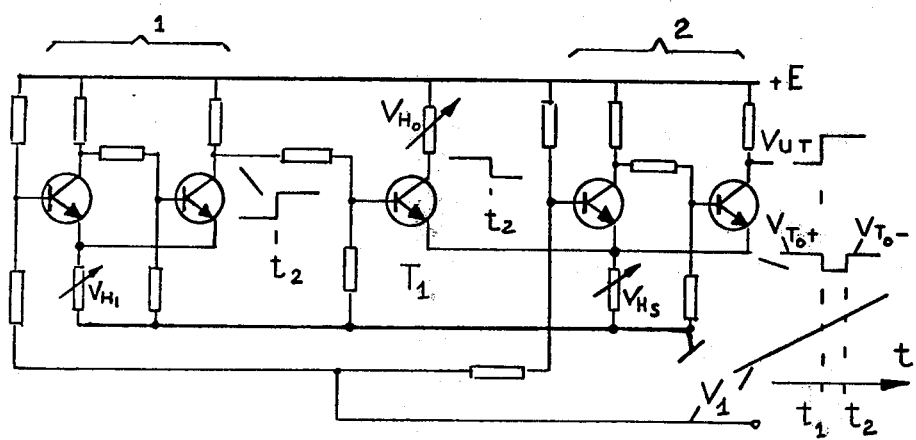
FIG. 17 is a circuit diagram of a voltage comparator in accordance with the present invention realized with Schmitt triggers.

In FIG. 17 there is shown how a voltage comparator may be realized by conventional Schmitt triggers. A current limited transistor switch $T_1$ is connected between the Schmitt triggers in the manner as shown in the drawing. The on and off switching of transistor switch $T_1$ is controlled by the voltage at the base electrode thereof while the amount of current conducted through transistor $T_1$ is limited by a current limiting resistor $V_{Ho}$. Accordingly, the function of resistor $V_{Ho}$ corresponds to that of FIG. 10. By varying the current through $T_1$ the voltage over a resistor $V_{Hs}$ will vary and thereby the operative hysteresis gap of the comparator may be varied.

In the circuit of FIG. 17 the reference voltage may, for example, be applied at each common emitter junction of each Schmitt trigger. The reference voltage may be supplied also at other points in the circuit as is obvious to the man skilled in the art. The reference voltage may also be an internal voltage derived from the circuit. If, for example, the comparator circuit of FIG. 17 is preceded by a differential amplifier, then the input voltage $V_{in}$ may be constituted by the voltage $V_1$ subjected to comparison minus the reference voltage $V_{ref}$.

Figure 18:
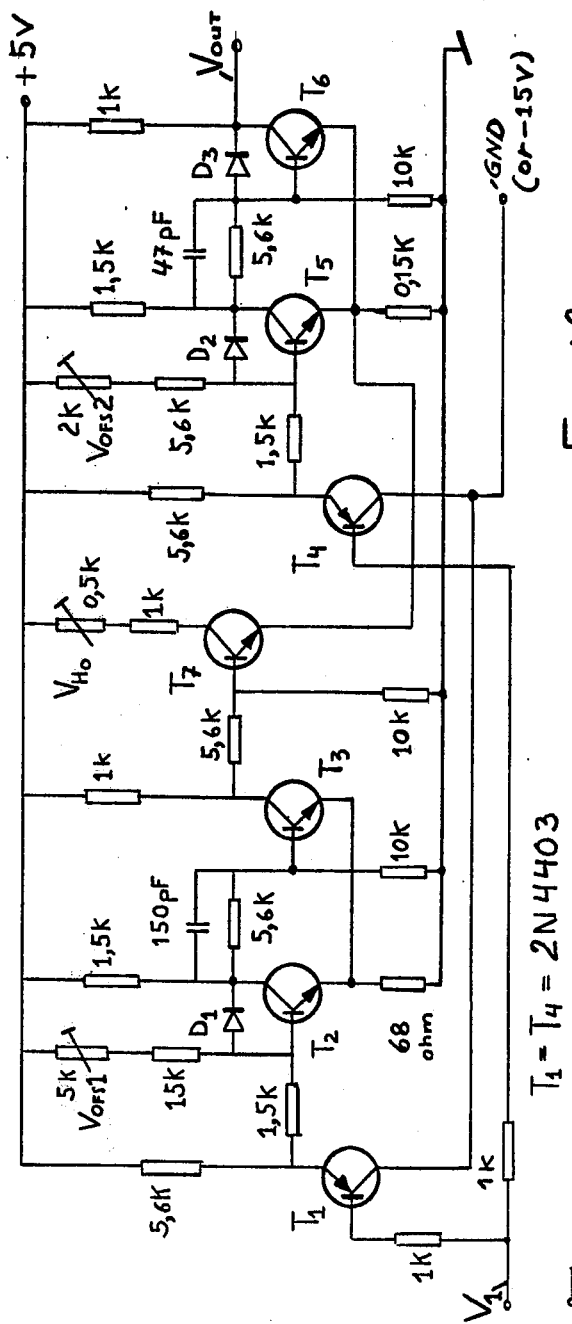
FIG. 18 is a detailed circuit diagram similar to that of FIG. 17 used as a zero crossing detector.

In FIG. 18 a tested circuit is shown. The circuit is similar to that of FIG. 17 with the exception that two emitter follows T1 and T4 have been added, the collector voltages of which may be zero volt or even negative which provides a higher input impedance for high amplitude input signals. The circuit operates as a zero crossing detector (that is, its hysteresis gap is adjustable to zero with the aid of potentiometer $V_{Ho}$).

Figure 19:
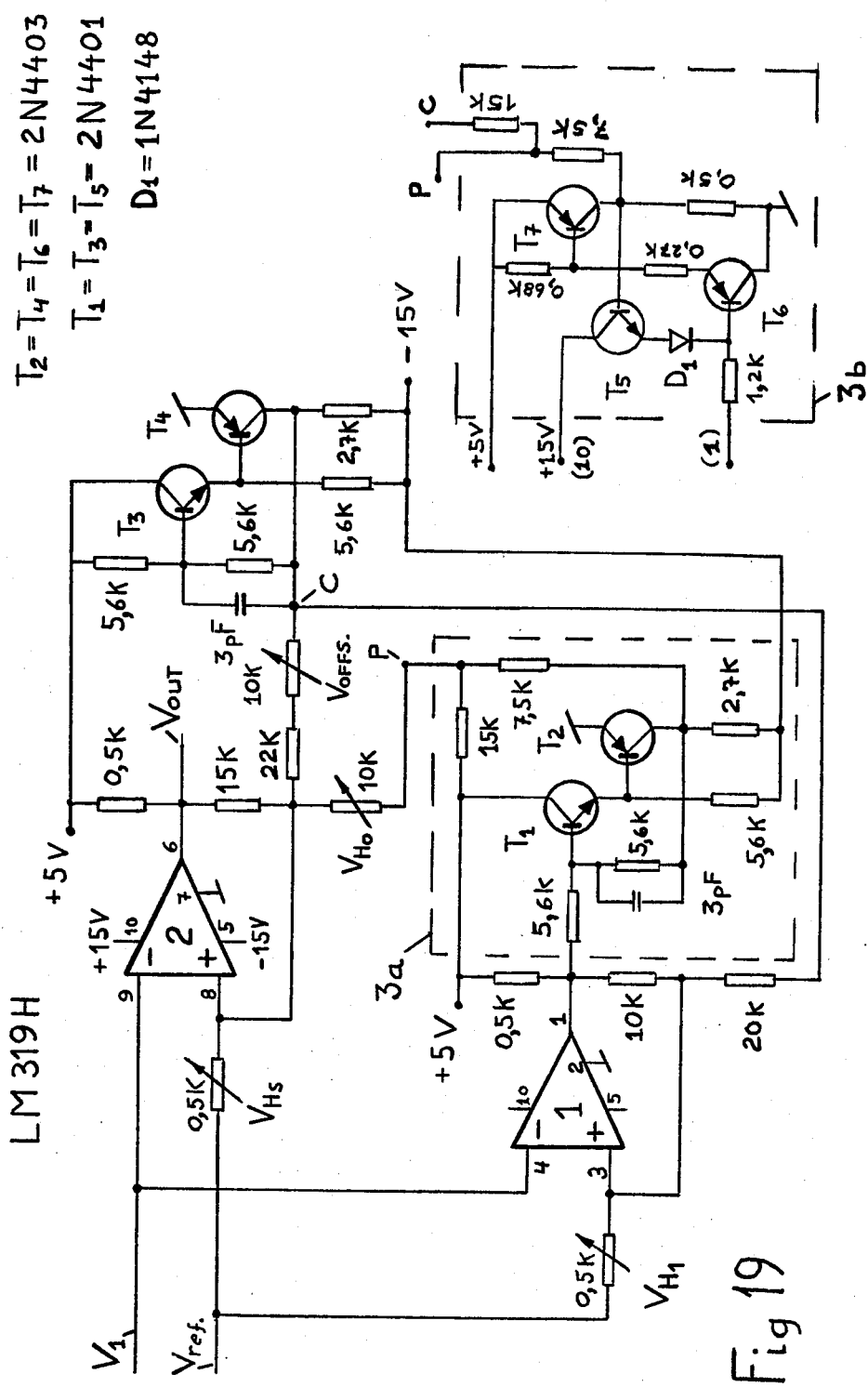
FIG. 19 is a detailed circuit diagram of a tested voltage comparator similar to that of FIG. 16 but also FIG. 11 by exchanging the linear amplifier 3a with a switch circuit 3b.

In FIG. 19 a circuit similar to that of FIG. 16 is shown. The circuit of FIG. 19 has TTL (transistor-transistor-logic) adapted output levels (ranging from 0 to +5 V). An inverting amplifier $3a$ shown within the dotted rectangle has an amplification factor of $-1$ at the collector of T2 and is inverting the output signal from comparator 1. In order to minimize the influence of a varying supply voltage, an amplifier comprising transistors T3, T4 and similar to amplifier $3a$ is used to invert the supply voltage +5V to nominal −5V in point C. This voltage is then used for level shift purposes.

The inverting amplifier $3a$ of FIG. 19 may be replaced with a transistor switch as shown within the dotted rectangle $3b$ shown to the right of FIG. 19.

Figure 20:
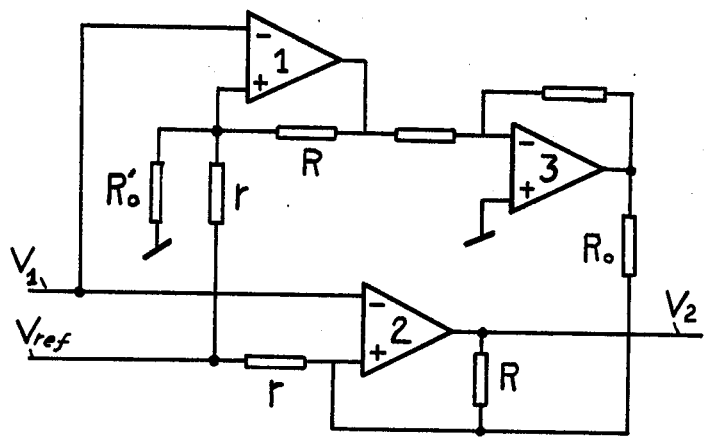
FIGS. 20 and 21 are modified circuits of the embodiments shown in FIGS. 10 and 15, respectively.
Figure 21:
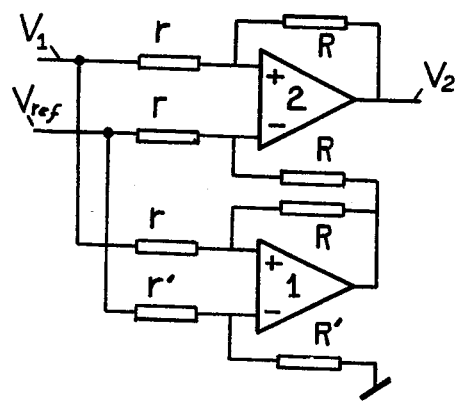

In the embodiments of FIGS. 10-19, it has been presupposed that $V_{ref}=0V$ for the sake of clarity. However, if $V_{ref}\neq 0$ V, then it may be required to provide a voltage divider at one of the inputs of either one or both of the amplifiers 1 or 2 in order to obtain a voltage division of the input voltage ($V_1$ and/or $V_{ref}$) to each amplifier, said voltage division being equal for both amplifiers. In FIGS. 20 and 21, which are equivalent to FIGS. 10 and 15, respectively, such a voltage division has been provided for by the addition of, for example, a resistor $R_o'$ (FIG. 20 wherein only $V_{ref}$ has been scaled similarly; a similar scaling of $V_1$ is possible at the inverting inputs) and r', R' (FIG. 21 wherein $V_1$ and $V_{ref}$ both have been scaled similarly), respectively.

The above described embodiments of the invention may be modified and varied within the scope of the present invention.

What is claimed is:

1. A voltage comparator including at least first and second amplifier circuits; input means for coupling the input circuit of each amplifier circuit to an input signal which is a function of the difference between a voltage to be compared and a reference voltage; threshold level shift means coupled between the output of the first amplifier circuit and the input circuit of the second amplifier circuit for modifying the threshold level of the second amplifier circuit in accordance with the output of the first amplifier circuit, the output of the second amplifier circuit forming the output of the voltage comparator; positive feedback circuits coupled to each of said amplifier circuits, respectively, for conditioning said amplifier circuits for bistable operation and for providing said first amplifier circuit with positive hysteresis; the output of said threshold level shift means being combined with the positive feedback signal of the second amplifier circuit, said combined signals being applied to said input circuit of said second amplifier circuit to establish a noise immune, bistable comparator having a hysteresis gap which is selectively greater than, less than or equal to zero depending upon the degree of positive feedback of said second amplifier circuit and the magnitude of the output signal of said threshold level shift means, the noise immunity of the comparator depending generally on the degree of positive feedback of said first amplifier circuit, which exhibits positive hysteresis.

2. The voltage comparator of claim 1 wherein said threshold level shift means comprises a third amplifier circuit.

3. The voltage comparator of claim 2 wherein the input circuit of said second amplifier circuit includes a non-inverting terminal; and wherein said third amplifier circuit is coupled to said non-inverting input terminal.

4. The voltage comparator of claim 2 wherein said third amplifier circuit operates as an inverting amplifier.

5. The voltage comparator of claim 1 wherein said threshold level shift means comprises resistance means.

6. The voltage comparator of claim 5 wherein the input circuit of said second amplifier circuit includes a non-inverting input terminal; and wherein said resistance means is coupled to said non-inverting input terminal.

7. The voltage comparator of claim 2 wherein the input circuit of said second amplifier circuit includes an inverting input terminal; and wherein said third amplifier circuit is coupled to said inverting input terminal.

8. The voltage comparator of claim 5 wherein the input circuit of said second amplifier circuit includes an inverting input terminal; and wherein said resistance means is coupled to said inverting input terminal.

9. The voltage comparator of claim 1 wherein the input circuit of said first amplifier circuit includes inverting and non-inverting input terminals, and the input circuit of said second amplifier circuit includes inverting and non-inverting input terminals; and wherein said input means couples said input signal to respective input terminals of the same type so that said first and second amplifier circuits operate in the same mode.

10. The voltage comparator of claim 1 wherein the input circuit of said first amplifier circuit includes inverting and non-inverting input terminals, and the input circuit of said second amplifier circuit includes inverting and non-inverting input terminals; and wherein said input means couples said input signal to respective input terminals of said first and second amplifier circuits of opposite types so that said first and second amplifier circuits operate in different modes from each other.

11. The voltage comparator of claim 2 wherein said third amplifier circuit comprises a switching circuit whose output is limited to predetermined levels.

12. The voltage comparator of claim 2 wherein said third amplifier circuit comprises a linear amplifier.

13. The voltage comparator of claim 2 wherein said third amplifier circuit is a voltage comparator.

14. The voltage comparator of claim 1 wherein said level shift means includes capacitor means for delaying a shift in the threshold level applied to the input circuit of said second amplifier circuit.

15. The voltage comparator of claim 1 wherein said input means comprises voltage dividing means.

16. The voltage comparator of claim 1 wherein said input means comprises low-pass filtering means.

* * * * *